United States Patent [19]
Yagi et al.

[11] 4,032,957
[45] June 28, 1977

[54] SEMICONDUCTOR DEVICE

[75] Inventors: Hajime Yagi, Tokyo; Tadaharu Tsuyuki, Isehara, both of Japan

[73] Assignee: Sony Corporation, Tokyo, Japan

[22] Filed: Oct. 7, 1975

[21] Appl. No.: 620,293

Related U.S. Application Data

[63] Continuation-in-part of Ser. No. 427,647, Dec. 26, 1973, abandoned.

[30] Foreign Application Priority Data

Dec. 29, 1972 Japan .................................. 48-551
Oct. 31, 1974 Japan ............................ 49-125868

[52] U.S. Cl. .................................... 357/37; 357/34; 357/35; 357/40; 357/88; 357/89; 357/90
[51] Int. Cl.² ................. H01L 29/00; H01L 29/72; H01L 29/747; H01L 27/02
[58] Field of Search .................. 357/34, 35, 37, 23, 357/89, 88, 90

[56] References Cited

UNITED STATES PATENTS 2,822,310   2/1958   Stieltjes ............................... 357/35

FOREIGN PATENTS OR APPLICATIONS 906,036   9/1962   United Kingdom ................. 357/35

Primary Examiner—Edward J. Wojciechowicz
Attorney, Agent, or Firm—Hill, Gross, Simpson, Van Santen, Steadman, Chiara & Simpson

[57] ABSTRACT

A semiconductor device having a high emitter-grounded current gain which includes an emitter region with the minority carrier diffusion length greater than its width and an additional region adjacent to the emitter region with the minority carrier diffusion length of this additional region greater than its width. The surface recombination velocity of the additional region is small. The minority carrier current injected from the additional region into the emitter balances that injected from the base into the emitter.

8 Claims, 7 Drawing Figures

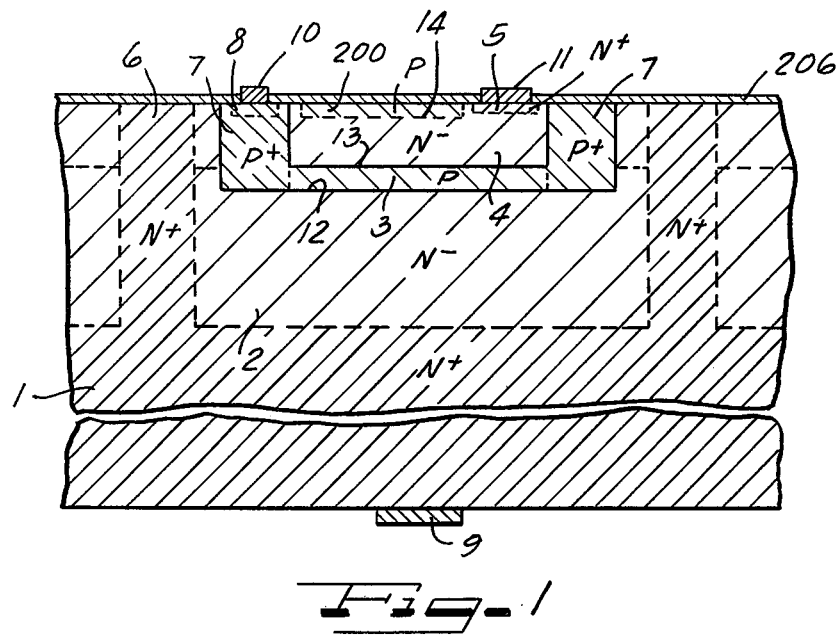
Fig-1
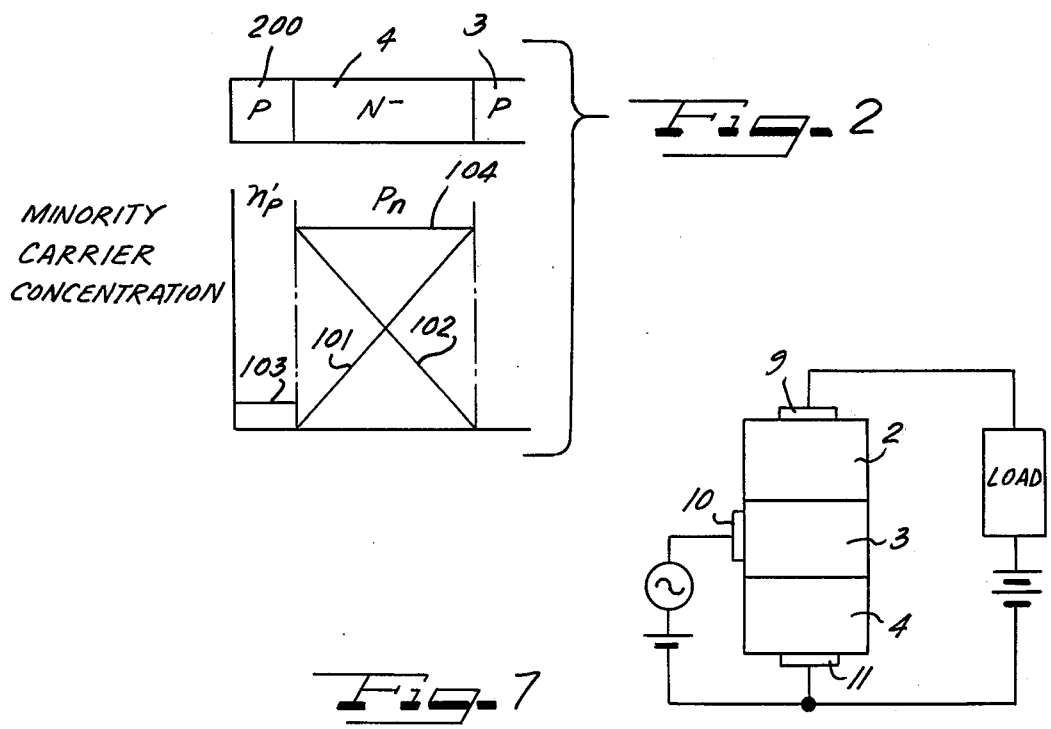
Fig-2
Fig-7

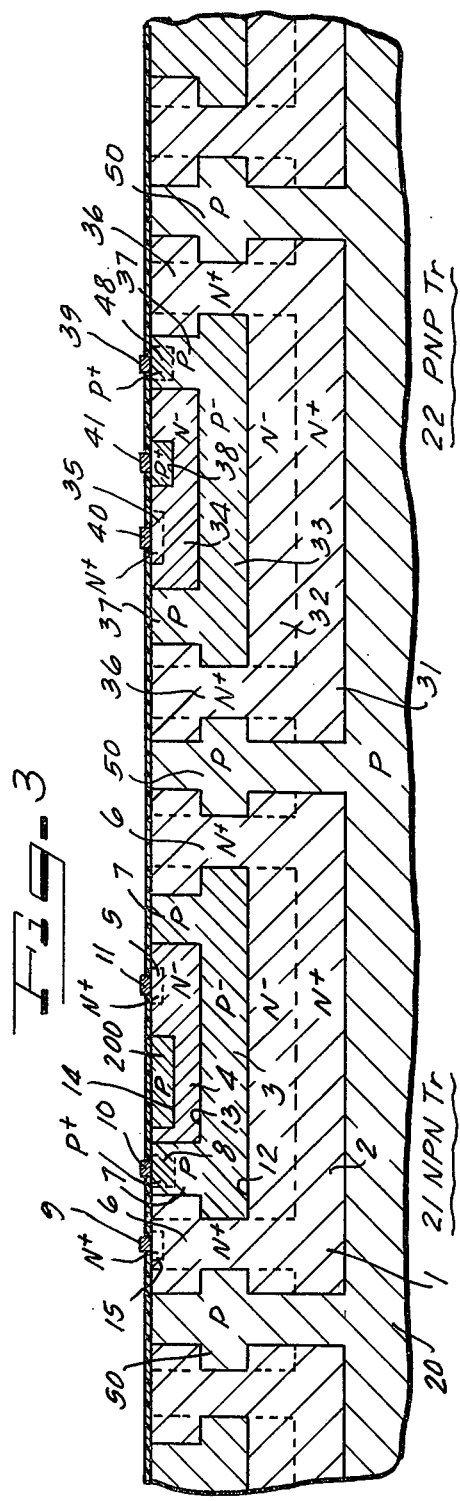
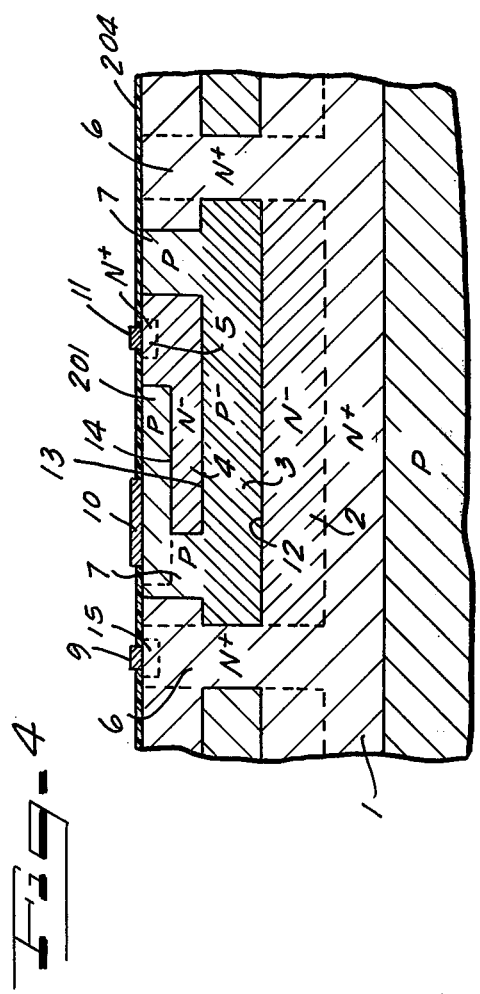
Fig-3
Fig-4

SEMICONDUCTOR DEVICE

CROSS REFERENCE TO RELATED APPLICATIONS

This application, is a continuation-in-part of applicants' copending application, Ser. No. 427,647, filed Dec. 26, 1973, now abandoned and assigned to the same assignee.

FIELD OF THE INVENTION

It has been common practice in fabricating conventional bipolar transistors to employ double diffusion technique to form an emitter-base junction in which the doping concentration of the emitter is made higher than the base. As this difference becomes larger, the emitter efficiency becomes greater and is more nearly unity. However, heavy doping increases lattice defects and dislocations in the semiconductor substrate. As a result of the heavy doping, the diffusion length of the minority carriers is decreased in the doped area. Decreasing the doping in prior art forms of transistors has been accompanied by a decrease in gain.

Stieltjes et al. U.S. Pat. No. 2,822,310 discloses an emitter of high resistivity in which the diffusion length is greater than the width and a floating region of opposite conductivity type forms a P-N junction with the emitter. As described in Stieltjes, the minority carriers in either of the emitter and the floating region are below the equilibrium concentration, and both minority carrier currents across the P-N junctions compensate each other. It is indicated in Stieltjes that the width of the floating region is larger than the diffusion length therein, and that hence the minority carrier current in the emitter can be minimum by minimizing the gradient of the minority carrier concentration in the floating region. It is also described that the P-N junction must not be forwardly biased, otherwise the minority carrier current in either of them is increased.

An article in Solid State Electronics, Vol. 13 (1970), p. 1025 disclosed a semiconductor transistor having an additional region in the emitter of the opposite conductivity type from the emitter and within the diffusion length of minority carriers in the emitter. The input signal is applied between the emitter and the additional region while the base is floating.

BRIEF SUMMARY OF THE INVENTION

It is an object of the present invention to provide a semiconductor device having greatly improved characteristics, including a very substantial increase in the grain factor.

It is a still further object of the present invention to provide a novel semiconductor device having improved low noise characteristics.

It is a still further object of the present invention to provide a novel semiconductor device having a high breakdown voltage and which prevents thermal run away.

Another and further object of the present invention is to provide a novel semiconductor device which may be employed as part of an integrated circuit along with conventional transistors including complementary transistors.

This invention relates to a semiconductor device, such for example, as a bipolar transistor or a thyristor, and particularly to a device having an emitter region with a minority carrier diffusion length $L_p$ greater than its width and an additional region contiguous with the emitter region with the minority carrier diffusion length $Ln'$ greater than the width of the additional region. The surface recombination velocity of the additional region is smaller than $Dn'/Ln'$. Surface recombination is usually defined in reference to a recombination velocity. This is the effective velocity at which all the minority carriers appear to be swept into the surface, where they are lost in surface trapping levels.

The minority carrier diffusion length in the emitter of a conventional transistor is believed to be on the order of 1 to 2 microns. The present invention provides a semiconductor device having a minority carrier diffusion length of 50 to 100 microns. The current amplification factor of a conventional transistor is roughly 500, while that of the present invention is 10,000 or more.

It is an object of the present invention to provide a novel semiconductor device having a high $h_{FE}$ (current gain factor) and a low noise characteristic.

BRIEF DESCRIPTION OF THE DRAWINGS

FIG. 1 is a diagrammatic fragmentary sectional section view of an NPN transistor embodying the novel features and characteristics of the present invention;

FIG. 2 shows the minority carrier concentration in the emitter region and in the additional region of the device shown in FIG. 1;

FIG. 3 is a fragmentary sectional view of an integrated circuit chip having an NPN transistor embodying the present invention and additionally a PNP transistor of a conventional design, thus providing a complementary pair of transistors in the integrated circuit chip;

FIGS. 4, 5 and 6 are fragmentary sectional views similar to FIG. 1, but showing other embodiments of the present invention; and FIG. 7 diagrammatically illustrates how the biasing means and the input signal may be applied to the structure of FIG. 1.

DESCRIPTION OF THE PREFERRED EMBODIMENTS

Figure 5:
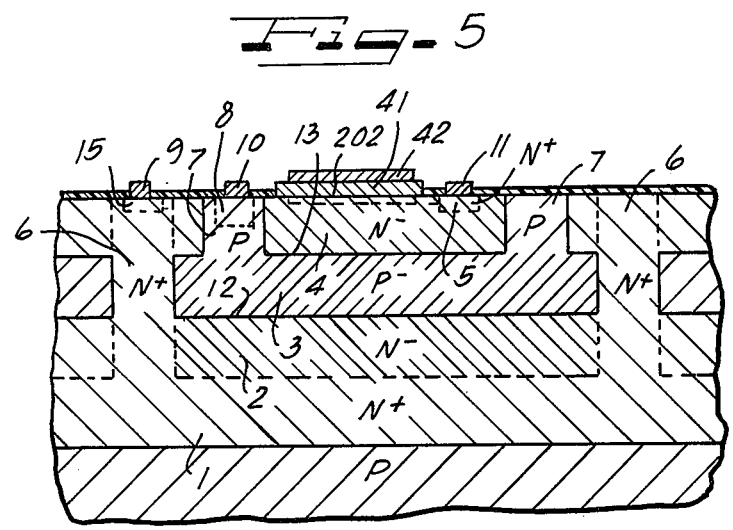

A preferred embodiment of the present invention, as embodied in an NPN transistor, is shown in FIG. 1. As shown, a substrate 1 heavily doped with N-type impurities or more specifically, a substrate 1 may be formed of silicon heavily doped with antimony. The doping is preferably $4 \times 10^{18}$ atoms/cm$^3$. This gives a resistivity of approximately 0.01 ohm-cm. It has been found that this doping may vary between 0.008 and 0.012 ohm-cm. The thickness of the substrate is preferably approximately 250 microns.

An N-type silicon epitaxial layer 2 is formed on the substrate 1 to be used as a collector together with the N+ substrate 1. This epitaxial layer 2 hereinafter referred to as the third region, is lightly doped with antimony sufficient to provide a doping concentration of $7 \times 10^{14}$ atoms/cm$^3$. The resistivity is approximately 8 to 10 ohm-cm. The epitaxial layer is preferably approximately 20 microns thick.

A P-type base region 3, hereinafter referred to as the second region, is then diffused or ion-implanted on the N- layer 2 to provide an active base for the transistor. The doping may be boron in sufficient quantity to give a doping concentration of $1 \times 10^{16}$ atoms/cm$^3$.

An n-type silicon epitaxial layer 4, hereinafter referred to as the first region, is then formed on said N-layer 2 to provide an emitter. The layer 4 is lightly doped with antimony, the doping concentration being approximately $5.5 \times 10^{15}$ atoms/cm$^3$. The resistivity is approximately 1 ohm-cm. The thickness of the layer 4 is approximately 2 to 5 microns.

An N+-type diffused layer 5, hereinafter referred to as the fifth region, is formed in the N− layer 4 to provide an emitter contact area. This layer 5 is doped with phosphor with a surface impurity concentration of $5 \times 10^{20}$ atoms/cm$^3$, and has a depth of about 1.0 micron.

A heavily doped diffused region 6 is provided surrounding the collector region and this region 6 penetrates into the N− collector layer 2. The impurity is phosphor and the doping is approximately $3 \times 10^{19}$ atoms/cm$^3$ as a surface concentration.

A P-type diffused region 7 penetrates through the N-emitter layer 4 into the P- base layer 3 which limits and surrounds the emitter 4. The dopant is boron and has a surface concentration of $7 \times 10^{19}$ atoms/cm$^3$. A P-type diffused region 8 is formed in the region 7 to provide a base contact area, the diffused region 8 being heavily doped with boron with a surface concentration of approximately $5 \times 10^{18}$ atoms/cm$^3$, and the penetration of the region 8 is approximately 1.8 microns.

A silicon dioxide layer 206 for passivation covers the upper surface of the device.

A collector electrode 9, formed of aluminum, is provided on the N+ substrate 1. A base electrode 10 of aluminum is formed on the base contact area 8. An emitter electrode 11 of aluminum is formed on the emitter contact area 5. A P-type region 200, sometimes hereinafter referred to as the additional region and sometimes as the floating region, is diffused in the N-emitter 4 to provide a PN junction between it and the emitter 4. The region 200 is doped with boron and is formed simultaneously with the forming of the base contact area 8. The doping concentration is $5 \times 10^{18}$ atoms/cm$^3$, and the depth of the layer 200 is approximately 1.8 microns.

From the above, it will be apparent that the N- layer 2 and the P region 3 form a collector-base junction 12. The P region 3 and the N- layer 4 form an emitter-base junction 13 and the N-layer 4 and the P additional region 200, as explained above, form an additional PN junction 14. The distance between the emitter-base junction 13 and the additional PN junction 14 is preferably 2 to 5 microns.

An emitter configuration formed in a lightly doped epitaxial layer is disclosed in Schlegel U.S. Pat. No. 3,591,430. See also French Pat. No. 2,130,399.

FIG. 3 illustrates a second embodiment of the present invention, where the NPN transistor described in FIG. 1 is formed in an integrated circuit with other semiconductor elements such, for example, as a PNP transistor. The integrated circuit, as shown, includes two different types of transistors such, for example, as conplementary transistors, namely, an NPN transistor 21 and a PNP transistor 22. These two transistors are formed in a substrate 20 of P-type silicon. As hereinbefore explained in connection with FIG. 1, the NPN transistor 21 includes a heavily doped collector region 1, a lightly doped collector region 2, a lightly doped base region 3, a lightly doped emitter 4, a heavily doped emitter contact area 5, a collector lead area 6, a collector area 15, a base lead area 7, a base contact area 8, an additional area 200, a collector electrode 9, a base electrode 10, and an emitter electrode 11.

The PNP transistor 22 has a P-type collector 33, an N-type base 34, a P-type emitter 38, a P-type collector lead 37, a P-type collector contact area 48, an N-type base contact area 35, a collector electrode 39, a base electrode 40, and an emitter electrode 41.

The transistors 21 and 22 are electrically isolated by PN junctions. A P-type isolation region 50 is connected to the P substrate 20 and surrounds both the NPN and the PNP transistors 21 and 22. Three N-type regions 31, 32 and 36 form a cup-shaped isolation area surrounding only the PNP transistor 22. In this integrated circuit, a plurality of couples or trios are formed simultaneously, for example, the N+ regions 1 and 31 are formed by selective diffusion into the P substrate 20. The N− regions 2 and 32 are formed by N-type epitaxial growth. The P− region 3 of the NPN transistor 21 and the P− region 33 of the PNP transistor 22 are formed by either an epitaxial growth or by selective diffusion. The N− region 4 of the NPN transistor 21 and the N− region 34 of the PNP transistor 22 are formed by an epitaxial growth. The N+ regions 6 and 36 are formed by an N-type diffusion. The P regions 7 and 37 are formed by a P-type diffusion. The P+ region 8 of the NPN transistor 21, the additional region 200 of the transistor 21, and the P+ region 38 of the PNP transistor 22 are formed by P-type diffusion. The N+ regions 5, 15 and 35 are formed by diffusion.

FIG. 4 shows a third embodiment of the invention wherein an additional area 201 is connected to the base-lead area 7 and the base 3. The base electrode 10 can be located on the additional area 201 but not widely.

FIG. 5 shows a fourth embodiment of this invention wherein an MIS (metal-insulator-semiconductor) structure is employed on the surface of the lightly doped emitter 4. An aluminum gate electrode 42 and a silicon dioxide layer 41 together with the emitter 4 form the MIS structure. By applying a predetermined voltage to the gate electrode 42, a barrier 202 occurs beneath the insulating layer 41. This is a reverse layer, a depletion layer, or an accumulation layer.

Figure 6:
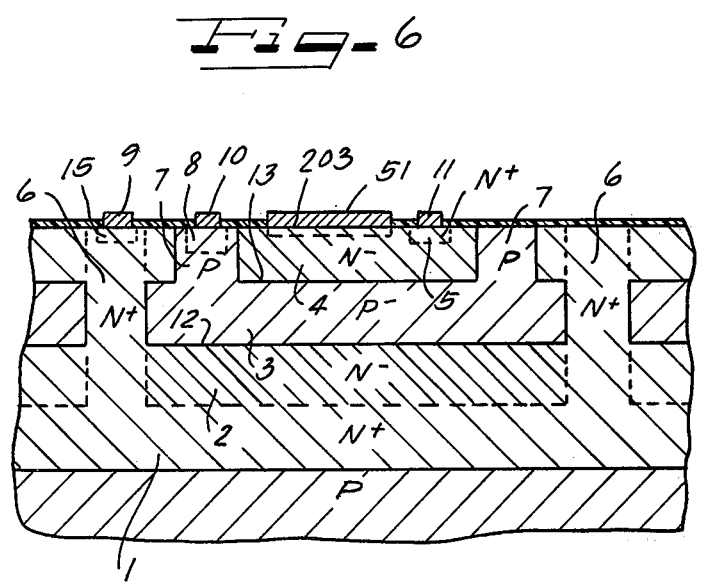

FIG. 6 illustrates a fifth embodiment of the present invention wherein a Schottky barrier layer 203 is created on a surface of the lightly doped emitter 4. A suitable metal 51, such for example, as platinum is deposited on the N− emitter 4 to form the Schottky barrier.

FIG. 2 is a visual showing of the minority carrier concentration in the emitter of the device shown in FIG. 1. The top portion of the figure locates the emitter 4 and the P region 200. The graph shows the injected minority carrier concentration in the emitter and the P region 200 respectively. The components caused by injected holes in the emitter 4 from the emitter-base junction 13 and the additional junction 14 are shown by the gradient lines 101 and 102, respectively. The component caused by injected electrons in the P region 200 from the additional junction 14 is shown by the gradient line 103. The composite gradient line 104 is substantially constant when the gradient line 103 is substantially level. This will be understood by a consideration of the equation $$I_{p2} = I_{p1} - I_{n1}$$

where $I_{p2}$ is the hole reinjection from region 200 to emitter 4, where $I_{p1}$ is the hole injection from the emitter 4 to the additional region 200, and $I_{n1}$ is electron injection from emitter 4 to the additional region 200. Since $I_{n1}$ is very small it can be neglected. Hence $I_{p2} =$ $I_{p1}$, and this makes the curve 104 substantially flat. To explain this in a more detailed fashion, it will be noted that the minority carriers (the holes) injected through the emitter-base junction 13 reach the additional junction 14 and enter into the additional region 200. The additional junction 14 is forwardly biased and the P region 200 also injects holes into the N-type emitter 4 and these holes pass through the emitter and reach the emitter-base junction 13 because the width of the emitter ($W_E$) is smaller than the diffusion length in the N-emitter 4. The holes injected from the additional junction 14 decrease in number from junction 14 to junction 13. Holes injected from the base-emitter junction 13 decrease in number from junction 13 to junction 14. The hole concentration across the emitter is thus the sum of the minority carrier concentration gradient lines 101 and 102. When the hole injection from the P region 200 is large enough, the sum of the gradient lines 101 and 102 will result in a substantially constant carrier concentration across the emitter, as shown by line 104 in the graph of FIG. 2, and this decreases the hole current from the base 3 to the emitter 4.

The structure of FIG. 1, above described, provides a high $h_{FE}$ characteristic and low noise. In explanation of why this result is obtained, it will be noted that the emitter-grounded current gain ($h_{FE}$) is one of the important parameters of the transistor. This is generally given as $$h_{FE} = \frac{\alpha}{1-\alpha} \tag{1}$$

where, $\alpha$ is a base-grounded current-gain. The current gain $\alpha$ is given as $$\alpha = \alpha^* \cdot \beta \cdot \gamma \tag{2}$$

where $\alpha^*$ is a collector multiplication ratio, $\beta$ is a base-transport factor, and $\beta$ is a emitter efficiency.

In an NPN transistor, for example, the emitter efficiency $\gamma$ is given as $$\gamma = \frac{Jn}{Jn + Jp} = \frac{1}{1 + Jp/Jn} \tag{3}$$

where $Jn$ is the electron current density resulting from the electrons which are injected through the emitter-base junction from the emitter to the base, and $Jp$ is a hole current density of the holes which are injected through the same junction from the base to emitter reversely.

The electron current density $Jn$ is given as $$Jn = \frac{q \cdot Dn \cdot np}{Ln} \cdot (e^{\frac{qv}{kT}} - 1) \tag{4}$$

$$Jp = \frac{q \cdot DP \cdot Pn}{Lp} \cdot (e^{\frac{qv}{kT}} - 1) \tag{5}$$

where $Ln$ is the electron diffusion length in the P-type base, $Lp$ is the hole diffusion length in the N-type emitter, $Dn$ is the electron diffusion constant, $Dp$ is the hole diffusion constant, $np$ is the minority electron concentration in P-type base in a state of equilibrium, $Pn$ is the minority hole concentration in N-type emitter in a state of equilibrium, $v$ is the voltage applied to the emitter-base junction, $T$ is the temperature, $q$ is the charge on the electron, and k is Boltzmann's constant.

The carrier diffusion constants $Dn$ and $Dp$ are functions of a carrier mobility and the temperature and they can be substantially constant.

In the present invention, the minority carrier diffusion length $Ln'$ in the additional region is selected larger than its width $Wp$ and the surface recombination velocity of the additional region is selected smaller than $Dn'/LN'$. $Dn'$ is the electron diffusion constant in the additional region. $Ln'$ depends on the impurity concentration and can be over 10 microns. In this case, the minority carrier current injected in the additional region is smaller than the case where $Wp$ is larger than $Ln'$, since it is multiplied by the term $Wp/Ln'$. As the loss in the additional region is very small the holes current in the emitter injected from the additional region is substantially equal to that injected from the emitter-base junction. The minority carrier concentration in the emitter is much above equilibrium.

In the present invention, Jp is amended as $$Jp = \frac{q \cdot Dp \cdot Pn \cdot W_E}{Lp^2} \cdot (e^{\frac{qv}{kT}} - 1) \tag{6}$$

Thus, the decrease of $Jp$ makes the value $\gamma$ close to unity according to equation (3), the value $\alpha$ high by equation (2), and the value $h_{FE}$ high by equation (1).

The low noise characteristics may be explained as follows. The lattice defect or the dislocation is largely decreased because the emitter-base junction 13 is formed by the lightly doped emitter 4 and also lightly doped base 3. The impurity concentration of the lightly doped emitter 4 should be limited by consideration of the noise characteristics, the life time $\tau_p$ and the minority carrier diffusion length $Lp$, to a value where the impurity concentration is approximately less than $10^{18}$ atoms/cm$^3$.

Another factor causing a low noise level is that the emitter current flows almost in a vertical direction in the lightly doped emitter 4 and the lightly doped base 3.

In this invention, an L-H junction is formed by the lightly doped region 4 and the heavily doped region 5. The distance between the L-H junction and the emitter-base junction is smaller than the minority carrier diffusion length Lp. The difference in impurity concentrations between the fifth and first regions is selected to provide an energy barrier higher than the energy level of the injected minority carriers injected into said first region from said second region and reaching the L-H junction. A built-in-field is formed adjacent said L-H junction and acts in such a direction that the hole current from the emitter-base junction 13 is reflected toward the junction 13. When the built-in-fields is large enough, the diffusion current of holes towards the layer 5 is effectively decreased.

FIG. 7 of the drawings diagrammatically illustrates one way in which the transistor of FIG. 1 may be biased and have the input signal applied. The configuration shown is an emitter grounded configuration. It is, of course, also possible to have a base grounded configuration.

While the invention is exemplified in FIG. 1 as being an NPN transistor, it will, of course, be understood that it may be a PNP transistor with comparable structure and characteristics. It will further be understood that the invention may be embodied as a semiconductor thyristor of the NPNP type.

We claim as our invention:

1. A semiconductor device comprising:
    a first semiconductor region of a first conductivity type;
    a second semiconductor region of a second conductivity type forming a first P-N junction with said first region;
    a third semiconductor region of said first conductivity type forming a second P-N junction with said second region which is spaced from said first P-N junction by said second region;
    a fourth semiconductor region of said second conductivity type forming a third P-N junction with said first region which is spaced from said first P-N junction by said first region;
    means for biasing said first junction forwardly and transporting the majority carriers in said first region to said third region, said fourth region not being connected to external biasing;
    the distance between said first and third junctions being smaller than the diffusion length of minority carriers in said first region; and
    the width of said fourth region being selected such that the current of minority carriers in said first region injected from said third junction is substantially equal to that from said first junction.

2. A semiconductor device comprising:
    a first semiconductor region of a first conductivity type;
    a second semiconductor region of a second conductivity type forming a first P-N junction with said first region;
    a third semiconductor region of said first conductivity type forming a second P-N junction with said second region which is spaced from said first P-N junction by said second region;
    a fourth semiconductor region of said second conductivity type forming a third P-N junction with said first region which is spaced from said first P-N junction by said first region;
    means for biasing said first junction forwardly and transporting the majority carriers in said first region to said third region;
    the width of said first region being smaller than the minority carrier duffusion length therein; and
    the width of said fourth region being smaller than the minority carrier diffusion length therein.

3. A semiconductor decice comprising:
    a first semiconductor region of a first conductivity type;
    a second semiconductor region of a second conductivity type forming a first P-N junction with said first region;
    a third semiconductor region of said first conductivity type forming a second P-N junction with said second region which is spaced from said first P-N junction by said second region;
    a fourth semiconductor region of said second conductivity type forming a third P-N junction with said first region which is spaced from said first P-N junction by said first region;
    means for biasing said first junction forwardly and transporting the majority carriers in said first region to said third region;
    a portion of said second region partially extending around a lateral edge of said first region and connecting with said fourth region; and
    the width of said first region below said fourth region being smaller than the minority carrier diffusion length therein
    whereby the current of minority carriers in said first region injected from said third junction substantially balances injected minority carrier current from the first junction.

4. A semiconductor device according to claim 3 in which the width of said fourth region is smaller than the minority carrier diffusion length therein.

5. A semiconductor device according to claim 2, in which the surface recombination velocity of said fourth region is smaller than D/L, where D and L are the minority carrier diffusion constant and the minority carrier diffusion length in said fourth region, respectively.

6. A semiconductor device according to claim 3, in which the surface recombination velocity of said fourth region is smaller than D/L, where D and L are the minority carrier diffusion constant and the minority carrier diffusion length in said fourth region, respectively.

7. A semiconductor device comprising:
    a first semiconductor region of a first conductivity type;
    a second semiconductor region of a second conductivity type forming a first P-N junction with said first region;
    a third semiconductor region of said first conductivity type forming a second P-N junction with said second region which is spaced from said first P-N junction by said second region;
    means for biasing said first junction forwardly and transporting the majority carriers in said first region to said third region;
    the width of said first region being smaller than the diffusion length of minority carriers therein;
    an insulating layer on at least a portion of a face of said first region opposite said first P-N junction; and
    gate electrode means on said insulating layer and biasing means connected to said gate electrode for inducing a depletion region or an accumulation region below said face.

8. A semiconductor device comprising:
    a first semiconductor region of a first conductivity type;
    a second semiconductor region of a second conductivity type forming a first P-N junction with said first region;
    a third semiconductor region of said first conductivity type forming a second P-N junction with said second region which is spaced from said first P-N junction by said second region;
    means for biasing said first junction forwardly and transporting the majority carriers in said first region to said third region;
    the width of said first region being smaller than the diffusion length of minority carriers therein; and
    Schottky barrier means at a face of said first region opposite said first P-N junction and biasing means connected to said Schottky barrier for inducing a depletion region below said face.

* * * * *